United States Patent [19]

Lombardo et al.

[11] 3,978,252

[45] Aug. 31, 1976

[54] METHOD OF IMPROVING THE ADHESION BETWEEN A MOLDED RESIN SUBSTRATE AND A METAL FILM DEPOSITED THEREON

[75] Inventors: Michael S. Lombardo, Waterbury; Elaine F. Jacovich, Cheshire; Eugene D. D'Ottavio, Thomaston; John J. Grunwald, New Haven, all of Conn.

[73] Assignee: MacDermid Incorporated, Waterbury, Conn.

[22] Filed: Feb. 24, 1975

[21] Appl. No.: 552,539

Related U.S. Application Data

[63] Continuation of Ser. No. 344,279, March 23, 1973, abandoned.

[52] U.S. Cl. .................................. 427/299; 106/1; 427/98; 427/99; 427/250; 427/304; 427/305; 427/306; 428/418; 428/457
[51] Int. Cl.² ...................... C23C 3/02; C23C 13/02
[58] Field of Search .............. 427/98, 99, 304, 305, 427/306, 250, 299; 106/1; 428/457, 418

[56] References Cited
UNITED STATES PATENTS

| | | | |
|---|---|---|---|
| 3,353,986 | 11/1967 | Mathias | 117/47 A |
| 3,445,326 | 5/1969 | Hurst | 161/207 |
| 3,467,540 | 9/1969 | Schick | 427/304 |
| 3,475,186 | 10/1969 | Dutkewych | 106/1 |
| 3,619,246 | 11/1971 | Bragole | 117/47 A |
| 3,620,933 | 11/1971 | Grunwald et al. | 117/47 A |
| 3,783,012 | 1/1974 | Morita et al. | 117/107 |
| 3,808,028 | 4/1974 | Lando | 427/306 X |

*Primary Examiner*—Ralph S. Kendall
*Assistant Examiner*—John D. Smith
*Attorney, Agent, or Firm*—St. Onge Mayers Steward & Reens

[57] ABSTRACT

An improvement is obtained in the bond strength between members of a laminate comprising a plastic substrate and a metal film through a process of first laminating to the plastic substrate a thin, sacrificial, anodized metal foil by heat and pressure, chemically stripping the foil from the substrate surface, activating the surface for electroless plating and electrolessly depositing a metal thereon, wherein the substrate is contacted with an aqueous solution containing an organic silicon compound at some stage subsequent to said chemical stripping operation. The final metal film when applied to the substrate exhibits consistently better adhesive strength than is obtained without the organic silicon treatment.

11 Claims, No Drawings

METHOD OF IMPROVING THE ADHESION BETWEEN A MOLDED RESIN SUBSTRATE AND A METAL FILM DEPOSITED THEREON

This is a continuation of application Ser. No. 344,279, filed Mar. 23, 1973, now abandoned.

BACKGROUND OF THE INVENTION

This invention relates to a method of preparing a plastic substrate to improve the characteristics of its surface for the bonding thereto of a subsequently applied metal film, such as an electrolessly deposited metal film. The invention relates both to an improved laminate comprising a plastic substrate and metal film, as well as to the substrate itself, useful especially in the production of "additive" circuit boards for electrical and electronic equipment.

The method here disclosed is generally similar to that disclosed in U.S. Pat. Nos. 3,620,933 and 3,666,549, and is a modification of the procedure disclosed in copending application Ser. No. 303,369, filed Nov. 3, 1972 now abandoned. The procedure involves initially bonding a sacrificial oxidized metal foil by heat and pressure to a surface of the polymer substrate which is ultimately to be metal plated or otherwise metallized. The sacrificial metal foil is chemically stripped or dissolved from the surface of the substrate, after which the permanent metal film is deposited by known techniques. Application of the sacrificial oxidized foil to, and subsequent chemical stripping of it from, the plastic surface produces a microporous topography on the substrate surface that provides improved bonding characteristics for electrolessly plated metal film.

This invention is directed to the improvement in the foregoing procedures obtained by subjecting the surface of the plastic substrate to contact with a solution containing an organic silicon compound at some stage of the process subsequent to stripping of the sacrificial foil from the substrate. The improvement obtained by this step is evidenced not only in greater bonding or peel strength between the substrate and final metal film, but more especially in greater retention of such bonding strength after exposure of the laminate to elevated temperatures as, for example, soldering.

One of the main requirements of printed circuits in general, and additive circuits in particular, is that they must exhibit strong bonding of the final metal coating to the plastic substrate. The industry has adopted a minimum requirement of approximately 8 pounds per linear inch for adhesion between the conductor metal and the plastic substrate. Along with this is the further important requirement in a satisfactory printed circuit that the metal-to-polymer bond be stable at elevated temperatures up to around 500° to 550°F. Indeed, printed circuit boards as mass-produced today are subject to soldering operations at temperatures of this order, which operations are used to permanently mount the various electronic components of the electrical circuit on the board. Quite frequently, such soldering operation involves partially dipping and momentarily holding the circuit board in a bath of molten solder in order to effect soldering of all junctions in one step. This produces a substantial thermal shock to the laminate. It is imperative, therefore, that such soldering operation does not weaken the metal-to-polymer bond below the industry specification as to minimum bond strength.

It has been found during extensive experimentation that many occasions arise where printed circuit boards show excellent metal-to-polymer adhesion at room temperature, but that a dramatic decrease of deterioration results because of soldering or other high temperature exposure. It is accordingly an objective of the present invention to provide a method of producing consistently higher peel strengths between the final metal conductor film and its supporting plastic substrate, to be able to do this over a wider range of operating conditions in the preparation of a printed circuit, and thus provide greater tolerance for variables which inherently and unavoidably arise in the commercial production operations. It is especially an objective of this invention to materially improve thermal shock resistance of the final metal-plastic composite.

As noted briefly above, it has now been found that contacting the surface of the plastic substrate, at some stage subsequent to the step of chemically stripping the sacrificial foil but at least cotemporaneously with the step of electroless plating, with a solution of an organic silicon derivative, more especially one of the class comprising the amino alkanoxy substituted silanes, results in substantially improving the adhesion of the conductor metal to the substrate both before and after soldering operations. The silane can be applied from either aqueous or non-aqueous solution and may constitute a totally separate step in the process of effecting an electroless metal deposit on the substrate, or it may be incorporated in one of the activating and/or plating operations.

The mechanism by which the silicon derivative exerts its favorable reaction is not well understood. However it appears that the effect is one of slowing down the rate of deposition of the electroless metal, whereby there is more opportunity for the metal to fill in the microscopic crevices reproduced in the surface of the substrate by the sacrificial metal foil. It is postulated that the slowing down of the rate of deposition of electroless metal helps to prevent the bridging-over of the crevices by the metal before a firm root or anchor is established in the interstices by the deposition metal in the electroless deposition process. Whatever the explanation, the presence of trace amounts of silicon compounds on the surface during the metal deposition provides a definite improvement.

Silicon derivatives, and silanes in particular, have been widely used in industry to promote the physical properties of various "killed" polymers. Filled polymers are made by blending into the polymer during its molding operation particles of titanium dioxide, asbestos, sand and other solids. Silanes have been used to promote the wetting of the solid particles with the polymers during the molding operation, thereby avoiding de-wetting or separation of the plastic from the filler material during mechanical stress. There are numerous references in the literature relating to the use of silicon derivatives or reactive silanes in various interfacial applications. One excellent reference is entitled "Reactive Silanes as Adhesion Promoters to Hydrophilic Surfaces", by Edmond P. Plueddenann, published by Dow Corning Corporation, Midland, Michigan. Also, in the aforementioned pending application Ser. No. 303,369, the use of silanes during interfacial contacting of the sacrificial metal foil and plastic substrate is disclosed. It has also been proposed in the prior patent art, as for example in U.S. Pat. Nos. 3,475,186, 3,615,733 and 3,615,735, to incorporate silicon compounds directly in the electroless plating solution. So far as it is known, however, there has been no previous suggestion for using silane materials in combination with the sacrificial metal foil technique, where the silane is brought into contact with the substrate surface at any stage subsequent to the chemical stripping of the sacrificial foil. This procedure appears to afford certain advantages and improvements when used in place of, or in conjunction with, the silane treatment taught in the aforesaid pending application Ser. No. 303,369, or in the above-mentioned prior patents.

A wide variety of organic silicon derivatives is available but apparently not all are useful in the practice of the invention herein disclosed. The best results are obtained by the use of silane-type materials, and more particularly there is preferred for commercial practice of the invention a rather specific type of silane having the general formula:

$$R \cdot Si(R_1)_3$$

wherein R is a lower alkyl (up to 6 carbons) amino substituted radical, and $R_1$ is a lower alkanoxy (up to 3 carbons) radical.

The following examples illustrate the invention but it is understood that these are not to be considered as comprehensive of all silicon derivatives useful in the practice of the invention.

EXAMPLE I

A glass epoxy aluminum foil laminate is first prepared by a method similar to that described in U.S. Pat. No. 3,602,933, Example I. This comprises taking a sheet of aluminum foil of approximately 2 mil thickness and immersing it in an alkaline soak cleaner bath for 5 minutes at a temperature of around 190°F to remove surface grime and oil. The clean aluminum foil is then preferably etched slightly in ammonium bifluoride solution at room temperature for 3 minutes preliminary to anodic treatment in an electrolytic bath containing phosphoric acid (10% by volume) at 115°–120°F for about 3 minutes at a current density of 25–30 A.S.F.

The foil is then rinsed, dried for about 2 minutes at 300°F and laminated to a plastic substrate. The substrate consists of stacked piles (e.g. 8 in number) of glass fiber reinforced epoxy B-stage resin (for example Precision No. 1528) and the composite of resin and foil is placed in a laminating press using a release strip, such as a strip of cellophane, between the aluminum foil and platen in order to prevent sticking during the curing operation. The laminating press is preheated to a temperature of around 350°F, is then closed and the laminate components are preheated at a pressure of about 5 p.s.i. for 30 seconds, after which the pressure is raised to 250 p.s.i and the curing is continued at the same temperature and pressure for about 60 minutes. The resulting laminate is a hard, infusible resin substrate having the aluminum foil firmly adhered to its surface.

This aluminum clad laminate is optionally cleaned of any surface grime and is immersed, sprayed or otherwise contacted with an etchant solution capable of dissolving away all visible traces of the aluminum foil. As described in Example VII of the aforesaid U.S. Pat. No. 3,620,933, any of the usually employed aluminum etchant solutions, such as hydrochloric acid (10–40% by volume), or alkali metal hydroxide (5%–20% by weight), is effective. Typical treatment conditions comprise a solution temperature of 80°F to about 180°F, preferably about 100°–130°F, for a period of 2 to 30 minutes, but normally about 5 minutes at the preferred temperature. When the substrate is free of aluminum foil, it is dipped in aqueous phosphoric acid bath containing 50% by volume of phosphoric acid, for about 7 minutes at 160°–170°F, after which it is again thoroughly water rinsed.

The substrate is next placed in an aqueous solution of N-beta-(amino ethyl)-gamma-amino propyl trimethoxy silane in isopropanol for about 3 minutes at room temperature. The concentration of the silane is 4 ml/l in this solution.

The substrate is rinsed and is then ready for activation. In this example, the procedure employed is the so-called one-step activation technique described in U.S. Pat. No. 3,523,518, Example I. This comprises immersing the substrate in a palladium-stannous-chloride hydrosol activator solution, prepared in accordance with the teaching of the aforesaid patent, for about 3 minutes at room temperature; carefully rinsing and then immersing the substrate in an accelerating solution of fluoroboric acid; rinsing agan and placing the substrate in a commercial electroless copper plating solution (e.g., "Metex 9030", MacDermid Incorporated) for a period of about 20 minutes at room temperature; and finally rinsing and electroplating an additional copper deposit to a thickness of about 1 mil. The plated substrate is dried, and then subjected to an oven bake at 300°F for about 1 hour. The adhesion of the plated metal deposit to the plastic substrate of this sample was checked by the standard technique of measuring the pull of a 1-inch wide strip of metal peeled from the surface and pulled at 90° to that surface. The average adhesion value was found to be 8 to 10 pounds per inch.

A small sample of the same plated board was floated for 10 seconds on the surface of a solder pot filled with solder at a temperature of 500°–510°F. After cooling, the adhesion test gave a value of 8 ½ to 10 ½ pounds per inch.

For purposes of comparison, a second plated board is prepared using identically the same procedure described above except that the step of immersing the substrate in the silane bath is omitted. The adhesion of this sample is found to be about 4 to 6 pounds per inch before thermal shock test, and only 3 to 4 pounds after such test.

EXAMPLE II

The foregoing procedure was duplicated except in this instance the immersion of the plastic substrate in the silane solution was done after the activating step, rather than before it. All other conditions remain the same.

The results in this case showed average adhesion values for the electrolessly deposited copper of 9 to 10 pounds per inch.

EXAMPLE III

Again the procedure of Example I was followed with the exception that instead of subjecting the substrate to contact with the silane material in a separate operation, the silane was incorporated in the electroless copper solution. The concentration of the silane in that solution was kept at 4 ml/l, as before.

In this case, the peel strength of the resulting electrolessly plated substrate was found to be on the order of 9 ½ pounds before solder shock, and 10 pounds after a 10 second shock in solder at 505°F.

EXAMPLE IV

The procedure of Example I was repeated, with the exception that instead of employing a separate immersion of the etched laminate in a silane solution, the silane was incorporated in the fluoroboric acid accelerator solution preliminary to electroless plating. In this case, about 10 ml/l of the silane is added to the fluoroboric acid, and the substrate immersed in this solution for about 4 minutes. The rest of plating operations are unchanged. The metal-to-polymer adhesion using this procedure is about 10 pounds per inch after a 10 second thermal shock dip in molten solder at 510°F.

EXAMPLE V

The procedure of Example I is repeated through the step of immersing the laminate in the silane solution after etching the sacrificial foil from its surface. Instead of then electrolessly depositing a metal film, the laminates is subjected to a conventional vacuum metallizing process. Excellent adhesion is obtained between the metal and plastic.

EXAMPLE VI

The procedure of any of the foregoing examples is the same except that instead of copper plating the substrate, it is electrolessly nickel plated. Any commercial electroless nickel may be used, such as "Macuplex 9340" produced by MacDermid Incorporated. Alternatively a commercial electroless cobalt deposit may be employed. In each instance, the adhesion is consistently improved over laminates not subjected to the silane pretreatment.

It appears that the same silane compositions disclosed in the aforesaid application Ser. No. 303,369 are particularly useful in the practice of this invention. These include:

Vinyl-tris (beta methoxyethoxy) silane

gamma-Methacryloxy propyltrimethoxy silane

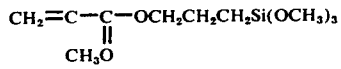

gamma-Glycidoxypropyl trimethoxy silane

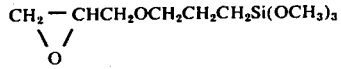

gamma-Aminopropyl trimethoxy silane

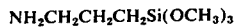

n-beta-(aminoethyl)-gamma-aminopropyltrimethoxy silane

In all cases, an optimum concentration of the silane (or mixture of silanes) appears to be about 4 ml per liter of solution. However some improvement in adhesion is evident with as little as 0.5 ml/l of silane, while generally no substantial improvement is noted at levels above about 5.0 ml/l. Optimum time of immersion is 3 to 4 minutes at room temperature but some degree of improvement is noted with as little as 30 seconds immersion, while periods of greater than 5 minutes provide no apparent benefit.

The silane is preferably employed in aqueous solution since this medium is used principally in conventional electroless plating practice. However organic solvents for the silane can be substituted, especially where a separate immersion step is employed, as in Examples I and II above.

What is claimed is:

1. The method of improving adhesion between a plastic substrate and a deposited film of metal formed in situ on the surface of the substrate by an electroless metal plating process, which comprises the steps of first forming a laminate of the plastic substrate and a sacrificial metal foil by bonding said foil to said substrate, chemically stripping said foil from the laminate thus formed, activating said substrate for electroless metal deposition, and electrolessly depositing said film of metal thereon, wherein said substrate is contacted by a dilute solution containing an organic silicon compound at some step subsequent to said chemical stripping operation but at least cotemporaneously with the electroless metal deposition step, said organic silicon compound being insufficient in amount to form an intermediate layer thereof between the substrate and said deposited film of metal, said silicon compound being a silane having the general formula:

where R is an amino substituted lower alkyl radical containing up to 6 carbons and $R_1$ is a lower alkanoxy radical containing up to 3 carbons.

2. The method as defined in claim 1, wherein said substrate is contacted with said organic silicon compound in solution after stripping said sacrificial foil and prior to activation of said substrate.

3. The method as defined in claim 1, wherein said substrate is contacted with said organic silicon compound in solution after activation of said substrate surface and prior to electroless deposition of metal thereon.

4. The method as defined in claim 1, wherein said substrate is contacted with said organic silicon compound in solution with said metal to be electrolessly deposited.

5. The method as defined in claim 1, wherein the plastic substrate is formed of an epoxy resin.

6. The method as defined in claim 1, wherein said sacrificial metal foil is aluminum anodized in phosphoric or sulfuric acid solution.

7. The method as defined in claim 1, wherein said silane is a member of the group consisting of gamma-aminopropyl trimethoxy silane and n-beta-(aminoethyl)-gamma-aminopropyl trimethoxy silane.

8. The method as defined in claim 1, wherein said silane is in aqueous solution and contains from about 0.5 ml to 5 ml per liter of said silane.

9. The method as defined in claim 8, wherein said substrate is immersed in said silane solution for from 30 seconds to 5 minutes at room temperature.

10. The method of improving the adhesion between a molded plastic substrate and a deposited film of metal formed in situ on the substrate by electroless metal plating or vacuum metallization processes, which comprises the step of subjecting said substrate to contact at room temperature by a dilute solution of an organic silicon compound preliminary to deposition of the metal film thereon, wherein said silicon compound is selected from the group consisting of vinyl-tris(beta-methoxy-ethoxy) silane, gamma-methacryloxy propyl-trimethoxy silane, gamma-glycidoxypropyl trimethoxy silane, gamma-aminopropyl trimethoxy silane and n-beta-(aminoethyl)-gamma-aminopropyl trimethoxy silane, and such silicon compound is present in solution from about 0.5 ml/l to 5.0 ml/l, said organic silicon compound being insufficient in amount in said solution to form an intermediate layer between said substrate and deposited metal film, said substrate being maintained in contact with said organic silicon containing solution for a period of from 30 seconds to 5 minutes.

11. The method as defined in claim 10, wherein the metal film is applied by vacuum metal deposition.

* * * * *